US006432817B1

(12) United States Patent
Bertrand et al.

(10) Patent No.: US 6,432,817 B1
(45) Date of Patent: Aug. 13, 2002

(54) TUNGSTEN SILICIDE BARRIER FOR NICKEL SILICIDATION OF A GATE ELECTRODE

(75) Inventors: Jacques J. Bertrand, Capitola; Christy Mei-Chu Woo, Cupertino; Minh Van Ngo, Fremont; George Kluth, Los Gatos, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/731,024

(22) Filed: Dec. 7, 2000

(51) Int. Cl.[7] ........................................... H01L 21/4763
(52) U.S. Cl. ....................... 438/651; 438/655; 438/682; 438/664; 438/592; 257/377; 257/382; 257/384
(58) Field of Search ................................ 438/651, 652, 438/655, 682, 683, 656, 664, 592, 597; 257/365, 382, 384, 377, 412, 413

(56) References Cited

FOREIGN PATENT DOCUMENTS

| JP | 03064970 | * 3/1991 | ......... H01L/29/784 |
|---|---|---|---|
| JP | 10074706 | * 3/1998 | ........... H01L/21/28 |

* cited by examiner

*Primary Examiner*—Wael Fahmy
*Assistant Examiner*—Kevin Ming Lee

(57) ABSTRACT

Nickel silicidation of a gate electrode is controlled using a tungsten silicide barrier layer. Embodiments include forming a gate electrode structure comprising a lower polycrystalline silicon layer, a layer of tungsten silicide thereon and an upper polycrystalline silicon layer on the tungsten silicide layer, depositing a layer of nickel and silicidizing, whereby the upper polycrystalline silicon layer is converted to nickel silicide and the tungsten silicide barrier layer prevents nickel from reacting with the lower polycrystalline silicon layer.

19 Claims, 2 Drawing Sheets

TUNGSTEN SILICIDE BARRIER FOR NICKEL SILICIDATION OF A GATE ELECTRODE

RELATED APPLICATIONS

This application contains subject matter similar to subject matter disclosed in copending U.S. patent application Ser. No. 09/731,006 filed on Dec. 7, 2000 and Ser. No. 09/731,026 filed on Dec. 7, 2000.

TECHNICAL FIELD

The present invention relates to the fabrication of semiconductor devices, particularly to self-aligned silicide (salicide) technology, and the resulting devices. The present invention is particularly applicable to ultra large scale integrated circuit (ULSI) systems having features in the deep sub-micron regime.

BACKGROUND ART

As integrated circuit geometries continue to plunge into the deep sub-micron regime, it becomes increasingly more difficult to accurately form discreet devices on a semiconductor substrate with the requisite reliability. High performance microprocessor applications require rapid speed of semiconductor circuitry. The speed of semiconductor circuitry varies inversely with the resistance (R) and capacitance (C) of the interconnection system. The higher the value of the R×C product, the more limiting the circuit operating speed. Miniaturization requires long interconnects having small contacts and small cross-sections. Accordingly, continuing reduction in design rules into the deep sub-micron regime requires decreasing the R and C associated with interconnection paths. Thus, low resistivity interconnection paths are critical to fabricate dense, high performance devices.

A common approach to reduce the resistivity of the interconnect to less than that exhibited by polycrystalline silicon alone, e.g., less than about 15–300 ohm/sq, comprises forming a multilayer structure consisting of a low resistance material, e.g., a refractory metal silicide, on top of a doped polycrystalline silicon layer, typically referred to as a polycide. Advantageously, the polycide gate/interconnect structure preserves the known work function of polycrystalline silicon and the highly reliable polycrystalline silicon/silicon oxide interface, since polycrystalline silicon is directly on top of the gate oxide.

Various metal suicides have been employed in salicide technology, such as titanium, tungsten, and cobalt. Nickel, however, offers particularly advantages vis-à-vis other metals in salicide technology. Nickel requires a lower thermal budget in that nickel silicide can be formed in a single heating step at a relatively low temperature of about 250° C. to about 600° C. with an attendant reduction in consumption of silicon in the substrate, thereby enabling the formation of ultra shallow source/drain junctions.

In conventional salicide technology, a layer of the metal is deposited on the gate electrode and on the exposed surfaces of the source/drain regions, followed by heating to react the deposited metal with underlying silicon to form the metal silicide. Unreacted metal is then removed from the dielectric sidewall spacers leaving metal silicide contacts on the upper surface of the gate electrode and on the source/drain regions. However, as device geometries continue to shrink and the height and width of gate electrodes are reduced, it was found increasingly difficult to control nickel silicidation of a silicon gate electrode, e.g., a polycrystalline silicon gate electrode. As nickel is highly reactive and diffusive, it was found difficult to prevent complete nickel silicidation of small sized polycrystalline silicon gate electrodes. A completely silicidized gate electrode is undesirable in that the known work function of polycrystalline silicon and the highly reliable polycrystalline silicon/silicon oxide interface would not be preserved. Moreover, upon complete silicidation of the gate electrode, penetration of nickel through the thin underlying gate insulating film would occur.

Accordingly, there exists a need for nickel silicidation technology in forming a polycide structure with controlled formation of nickel silicide on the gate electrode.

DISCLOSURE OF THE INVENTION

An advantage of the present invention is a semiconductor device exhibiting reduced parasitic RC time delays and containing transistors with polycide structures of polycrystalline silicon and nickel silicide.

Another advantage of the present invention is a method of manufacturing a semiconductor device exhibiting reduced parasitic RC time delays and containing transistors with polycide gate electrodes comprising polycrystalline silicon and nickel silicide.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved, in part, by a semiconductor device comprising: a silicon (Si)-containing substrate; a gate insulating layer on the substrate; and a transistor gate electrode, having opposing side surfaces, on the gate insulating layer, the gate electrode comprising: a layer of Si; a layer of tungsten silicide on the Si layer; and a layer of nickel silicide on the tungsten silicide layer.

Another advantage of the present invention is a method of manufacturing a semiconductor device, the method comprising: forming a gate insulating layer on a silicon (Si)-containing semiconductor substrate; depositing a first layer of Si on the gate insulating layer; depositing a layer of tungsten silicide on the first Si layer; depositing a second Si layer on the tungsten silicide layer; and patterning the second Si layer, tungsten silicide layer, first Si layer and gate insulating layer to form a transistor gate electrode structure having an upper surface and opposing side surfaces.

Embodiments of the present invention include forming an oxide liner, as at a thickness of about 130 Å to about 170 Å, on the side surfaces of the gate electrode, and then forming silicon nitride sidewall spacers, as at a thickness of about 850 Å to about 950 Å, on the oxide liner. The first and second silicon layers, such as polycrystalline silicon, can be deposited at similar heights, and the tungsten silicide layer, which can be deposited by physical vapor deposition (PVD) e.g., sputtering, or chemical vapor deposition (CVD), can be deposited at a thickness of about 10 Å to about 20 Å. The nickel layer is then deposited, as at a thickness of about 150 Å to about 500 Å, e.g., about 300 Å. Upon heating at a temperature of about 250° C. to about 600° C., e.g., about 400° C. to about 600° C., the deposited nickel reacts with underlying silicon in the second polycrystalline silicon layer to form nickel silicide. However, silicidation of the first polycrystalline silicon layer is substantially prevented by the tungsten silicide layer thereon.

Additional advantages of the present invention will become readily apparent to those skilled in the this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
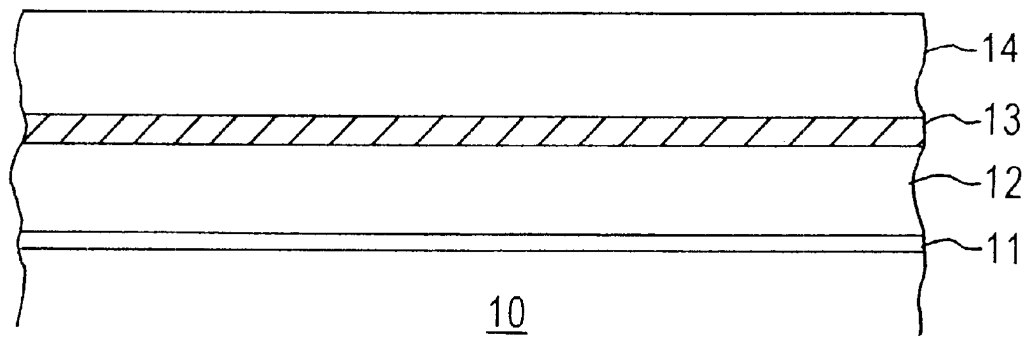
FIGS. 1–4 schematically illustrate sequential phases of a method in accordance with an embodiment of the present invention, wherein like features are denoted by like reference numerals.

The present invention addresses and solves problems attendant upon implementing conventional polycide methodology to form a gate electrode structure comprising doped polycrystalline silicon and a silicide layer thereon. As device geometries plunge into the deep sub-micron regime and the size of a gate electrode is reduced, it was found difficult to prevent complete nickel silicidation of the polycrystalline gate electrode. Complete silicidation of the gate electrode is disadvantageous in several respects, including the undesirable loss of the polycrystalline silicon work function and the highly reliable polycrystalline silicon/silicon oxide interface. In addition, penetration of the underlying gate insulating layer by nickel occurs.

In accordance with the present invention, the gate electrode is formed as a composite structure comprising a first or lower silicon layer and a second or upper silicon layer with a barrier layer therebetween. The barrier layer prevents silicidation of the first or lower silicon layer.

Embodiments of the present invention include forming a gate insulating layer on a silicon (Si)-containing semiconductor substrate in a conventional manner. A first Si layer is then deposited on the gate insulating layer, which Si layer can be amorphous silicon or polycrystalline silicon. A thin layer of tungsten silicide is then deposited on the first Si layer, as by sputtering or CVD at a suitable thickness, such as about 10 Å to about 20 Å. A second Si layer, e.g., amorphous Si or polycrystalline Si, is then deposited on the tungsten silicide layer. Patterning is then conducted in a conventional manner, as by employing conventional photolithographic and etching techniques, to form a gate electrode structure comprising an underlying gate insulating layer and a composite comprising patterned portions of the first Si layer, tungsten silicide layer and second Si layer thereon.

A thin oxide liner of silicon oxide is then formed, as by CVD, on the side surfaces of the gate electrode structure at a suitable thickness for further preventing silicidation via the side surfaces. A suitable thickness for the silicon oxide liner can be determined in a particular situation consistent with the disclosed objectives. For example, it was found that a silicon oxide liner having a thickness of about 130 Å to about 170 Å is suitable.

Silicon nitride sidewall spacers are then formed in a conventional manner, as by depositing a conformal layer followed by anisotropically etching. A layer of nickel is then deposited, as by CVD, followed by heating at an appropriate temperature to form nickel silicide, such as about 250° C. to about 600° C., e.g., about 400° C. to about 600° C. During heating, the deposited nickel reacts with Si of the second Si layer to form a layer of nickel silicide; however, the layer of tungsten silicide prevents nickel silicidation of Si in the underlying first Si layer.

Unreacted nickel on the silicon nitride sidewall spacers is then removed in a conventional manner, as by employing a mixture of sulfuric acid and hydrogen peroxide. The resulting nickel silicide layer is typically about one-half to about two-thirds of the height of the gate electrode. The tungsten silicide barrier layer effectively prevents consumption of the underlying first Si layer, thereby maintaining the polycrystalline silicon work function, preventing penetration of the gate electrode layer and maintaining the highly reliable polycrystalline silicon/silicon oxide interface.

An embodiment of the present invention is schematically illustrated in FIGS. 1 through 4. Adverting to FIG. 4, a gate insulating layer 11 is formed on semiconductor substrate 10. Semiconductor substrate 10 can be either p- or n-type, while gate insulating layer 11 can be a single oxide layer or plural oxide layers, such as deposited by plasma enhanced chemical vapor deposition (PECVD), thermal CVD, atmospheric pressure CVD, sub-atmospheric pressure CVD or by thermal oxidation. First Si layer 12, e.g., polycrystalline silicon, is then deposited, as at a thickness of about 350 Å to about 1,000 Å, e.g., about 500 Å to about 750 Å, as by a conventional CVD technique. It should be understood that both the first Si layer and the second Si layer are doped in a conventional manner to provide the requisite conductivity. A thin layer of tungsten silicide 13, e.g., about 10 Å to about 20 Å, is then deposited, as by sputtering. A second layer of Si 14, e.g., polycrystalline Si, is then deposited at about the same thickness as the first Si layer, resulting in the intermediate structure schematically illustrated in FIG. 1.

Figure 2:
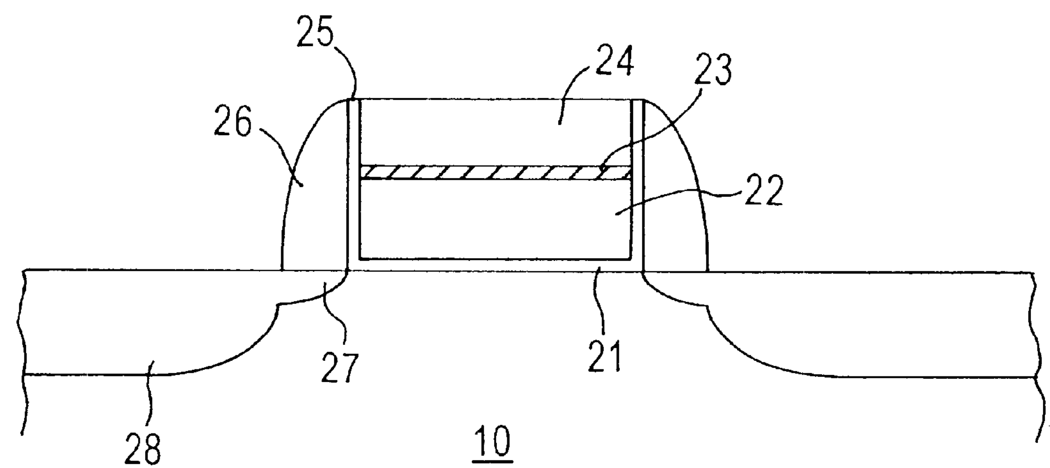

Patterning is then conducted by a known photolithographic technique followed by etching to form a gate electrode structure as schematically illustrated in FIG. 2 and comprising gate insulating layer 21, first polycrystalline silicon Si layer 22, tungsten silicide layer 23 and second polycrystalline Si layer 24, at a combined height of about 1,000 Å to about 3,000 Å. An oxide liner 25 is then formed on the side surfaces of the gate electrode structure, as at a thickness of about 130 Å to about 170 Å. Oxide liner 25 functions to prevent silicidation of the side surfaces of the gate electrode and improves insulation between the gate electrode and source/drain regions. Silicon nitride sidewall spacers 26 are then formed by depositing a conformal layer of silicon nitride followed by anisotropically etching, as with $CHF_3/O_2$ in a plasma etcher with sufficient selectivity to avoid etching the underlying polycrystalline silicon substrate. The silicon nitride sidewall spacers are typically formed at a thickness of about 850 Å to about 950 Å. The intermediate transistor structure schematically illustrated in FIG. 2 also comprises shallow source/drain extensions 27 and source/drain regions 28. These impurity regions can be formed in a conventional manner, as by ion implantation prior to forming silicon nitride sidewall spacers 26 to form the shallow source/drain extensions 27, and ion implantation subsequent to formation of the silicon nitride sidewall spacers 26 to form source/drain regions 28. As in conventional practices, the implanted impurities are electrically activated by thermal annealing.

Figure 3:
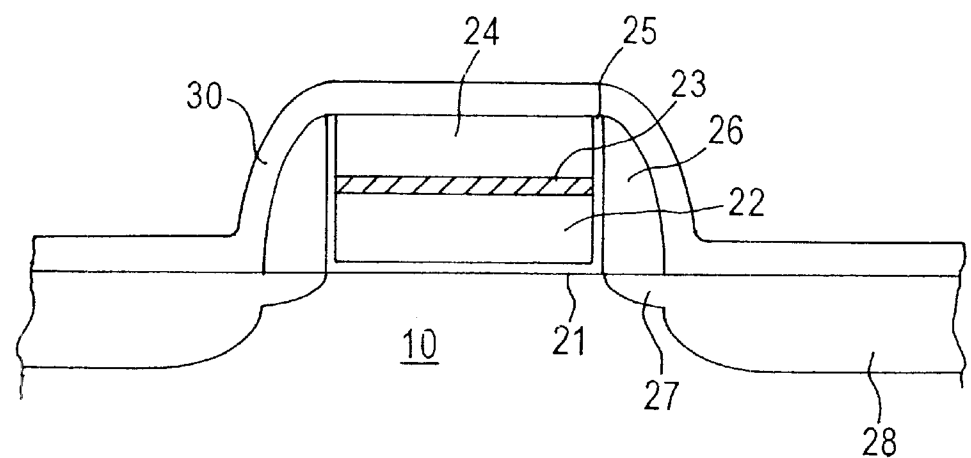
Figure 4:
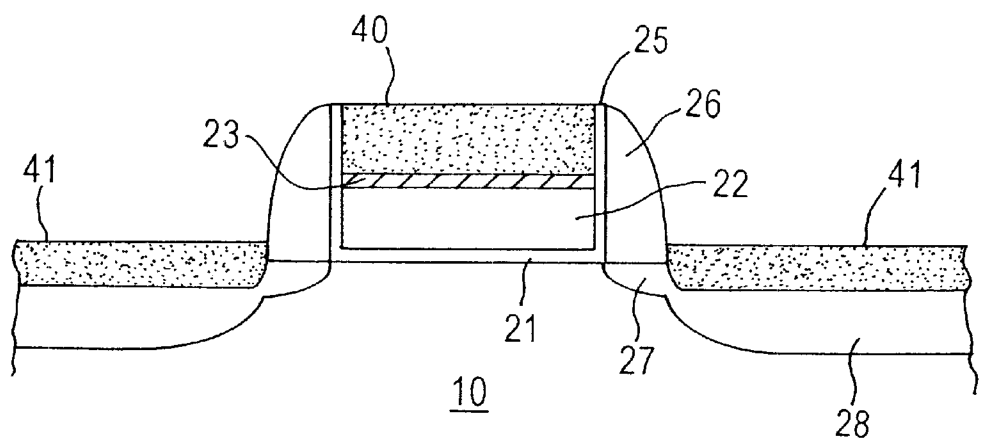

Adverting to FIG. 3, a layer of nickel 30 is then deposited at an appropriate thickness, such as about 700 Å to about 800 Å, typically by CVD. Heating is then conducted, as at a temperature of 250° C. to about 600°C., typically between about 400° C. to about 600°C., to form nickel silicide. During heating, as shown in FIG. 4, polycrystalline Si layer 24 reacts with deposited nickel 30 to form nickel silicide layer 40 on the gate electrode. Nickel silicide layer 40 typically has a thickness of about ½ to about ⅔ the gate electrode height. In addition, nickel layer 30 reacts with Si in the underlying substrate on the source/drain regions to form nickel silicide layers 41, typically at a thickness of about 200 Å to about 400 Å, e.g., about 300 Å. Advantageously, tungsten silicide layer 23 effectively prevents silicidation of first polycrystalline layer 22.

The present invention effectively enables the application of salicide technology to form polycide structures containing a layer of nickel silicide on polycrystalline silicon, while preventing a complete silicidation of the polycrystalline silicon gate electrode. Thus, the present invention enables nickel-polycide structures to be formed without penetration through the underlying gate insulating layer, while preserving both the known work function of polycrystalline silicon and the highly reliable polycrystalline silicon/silicon dioxide interface, since polycrystalline silicon is directly on the gate oxide layer.

The present invention enjoys industrial applicability in the manufacture of various types of semiconductor devices, particularly highly integrated devices with MOS transistors having features with dimensions in the deep sub-micron regime. The present invention enables the manufacture of highly reliable transistors with nickel-polycide structures, consistent with the high circuits speeds demanded by highly miniaturized integrated circuits.

In the preceding detailed description, the embodiments of the present invention are described with reference to specific exemplary embodiments thereof. It should be evident, however, that various modifications and changes may be made thereto without departing from the broader spirit and scope of the present invention as set forth in the claims. The specification and drawings are, accordingly, to be regarded as illustrative rather than in a restrictive since. It is, therefore, to be understood that the present invention is capable of use in various other combinations and environments and is capable of changes or modifications within the scope of the inventive concept as expressed herein.

What is claimed is:

1. A method of manufacturing a semiconductor device, the method comprising:

forming a gate insulating layer on a silicon (Si)-containing semiconductor substrate;

depositing a first layer of Si on the gate insulating layer;

depositing a layer of tungsten silicide on the first Si layer;

depositing a second Si layer on the tungsten silicide layer;

patterning the second Si layer, tungsten silicide layer, first Si layer and gate insulating layer to form a transistor gate electrode structure having an upper surface and opposing side surfaces;

depositing a layer of nickel on the upper surface of the gate electrode structure; and heating to react the nickel layer on the upper surface of the gate electrode structure with Si in the second Si layer to form a layer of nickel silicide.

2. The method according to claim 1, further comprising:

forming a silicon nitride sidewall spacer on the side surfaces of the gate electrode structure leaving exposed adjacent surfaces of the substrate;

depositing the layer of nickel on the upper surface of the gate electrode structure, sidewall spacers and exposed surfaces of the substrate; and heating to react the nickel layer on the upper surface of the gate electrode structure with Si in the second Si layer to form the layer of nickel silicide and to react the nickel layer with Si in the substrate to form nickel silicide layers on the exposed surfaces of the substrate, wherein the layer of tungsten silicide prevents nickel silicidation of the first Si layer.

3. The method according to claim 2, wherein the first and second Si layers comprise polycrystalline silicon.

4. The method according to claim 2, comprising forming source/drain regions in the substrate proximate the opposing side surfaces of the gate electrode structure, wherein the nickel silicide layers on the exposed substrate surfaces function as source/drain contacts.

5. The method according to claim 2, comprising forming an oxide liner on the side surfaces of the gate electrode structure before forming the silicon nitride sidewall spacers.

6. The method according to claim 5, comprising forming the oxide liner at a thickness of about 130 Å to about 170 Å.

7. The method according to claim 2, comprising heating at a temperature of about 400° C. to about 600° C. to form the nickel silicide layers.

8. The method according to claim 2, comprising depositing the nickel layer at a thickness of about 150 Å to about 500 Å.

9. The method according to claim 2, wherein the gate electrode structure comprises a gate electrode having a height of about 1,000 Å to about 3,000 Å on a gate insulating layer.

10. The method according to claim 9, comprising heating to react the nickel layer with the second Si layer to form the nickel silicide layer having a thickness of about ½ to about ⅔ the height of the gate electrode.

11. The method according to claim 9, comprising depositing the tungsten silicide layer at a thickness of about 10 Å to about 20 Å.

12. The method according to claim 2, comprising forming the silicon nitride sidewall spacers at a thickness of about 850 Å to about 950 Å.

13. The method according to claim 2, comprising removing unreacted nickel from the silicon nitride sidewall spacers after heating.

14. A semiconductor device comprising:

a silicon (Si)-containing substrate;

a gate insulating layer on the substrate; and a transistor gate electrode, having opposing side surfaces, on the gate insulating layer, the gate electrode comprising:

a layer of Si;

a layer of tungsten silicide on the Si layer; and a layer of nickel silicide on the tungsten silicide layer.

15. The semiconductor device according to claim 14, further comprising:

a silicon nitride sidewall spacer on the opposing side surfaces of the gate electrode;

source/drain regions in the substrate adjacent the opposing side surfaces of the gate electrode; and a layer of nickel silicide on the source/drain regions.

16. The semiconductor device according to claim 15, further comprising an oxide liner on the opposing side surfaces of the gate electrode with the silicon nitride sidewall spacers thereon.

17. The semiconductor device according to claim 16, wherein the oxide liner has a thickness of about 130 Å to about 170 Å and the silicon nitride sidewall spacers have a thickness of about 850 Å to about 950 Å.

18. The semiconductor device according to claim 15, wherein the gate electrode has a height of about 1,000 Å to about 3,000 Å.

19. The semiconductor device according to claim 18, wherein the nickel silicide layer of the gate electrode has a thickness of about ½ to about ⅔ the gate electrode height.

* * * * *